(12) United States Patent
Okhonin

(10) Patent No.: US 7,683,430 B2
(45) Date of Patent: Mar. 23, 2010

(54) ELECTRICALLY FLOATING BODY MEMORY CELL AND ARRAY, AND METHOD OF OPERATING OR CONTROLLING SAME

(75) Inventor: Serguei Okhonin, Lausanne (CH)

(73) Assignee: Innovative Silicon ISi SA, Lausanne (CH)

( * ) Notice: Subject to any disclaimer, the term of this patent is extended or adjusted under 35 U.S.C. 154(b) by 434 days.

(21) Appl. No.: 11/633,311

(22) Filed: Dec. 4, 2006

(65) Prior Publication Data
US 2007/0138530 A1 Jun. 21, 2007

Related U.S. Application Data

(60) Provisional application No. 60/751,505, filed on Dec. 19, 2005.

(51) Int. Cl.
*H01L 29/786* (2006.01)
(52) U.S. Cl. .............................. 257/350; 257/E27.085; 365/181
(58) Field of Classification Search ................. 257/350, 257/E27.085, 347; 365/181, 185, 18, 185.18
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |

(Continued)

FOREIGN PATENT DOCUMENTS

EP 0 030 856 6/1981

(Continued)

OTHER PUBLICATIONS

"An SOI voltage-controlled bipolar-MOS device", J.P. Colinge, IEEE Transactions on Electron Devices, vol. ED-34, No. 4, Apr. 1987, pp. 845-849.

(Continued)

*Primary Examiner*—Kenneth A Parker
*Assistant Examiner*—Paul A Budd
(74) *Attorney, Agent, or Firm*—Neil A. Steinberg

(57) ABSTRACT

An integrated circuit having a memory cell and/or memory cell array including a plurality of memory cells (as well as techniques for reading, controlling and/or operating, the memory cell, and/or memory cell array). Each memory cell includes at least one transistor having an electrically floating body transistor and an active access element. The electrically floating body region of the transistor forms a storage area or node of the memory cell wherein an electrical charge which is representative of a data state is stored in the electrically floating body region. The active access element is coupled to the electrically floating body transistor to facilitate programming of the memory cell and to provide a relatively large amount of majority carriers to the storage area or node of the memory cell during a write operation. The memory cell and/or memory cell array of the present inventions may be incorporated in an integrated circuit device, for example, a logic device (such as, for example, a microcontroller or microprocessor) or may comprise a portion of a memory device (such as, for example, a discrete memory).

35 Claims, 16 Drawing Sheets

U.S. PATENT DOCUMENTS

| | | |
|---|---|---|
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,791,610 A | 12/1988 | Takemae |
| 4,954,989 A | 9/1990 | Auberton-Herve et al. |
| 4,979,014 A | 12/1990 | Hieda et al. |
| 5,144,390 A | 9/1992 | Matloubian |
| 5,164,805 A | 11/1992 | Lee |
| 5,258,635 A | 11/1993 | Nitayama et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A * | 7/1998 | Assaderaghi et al. ........ 365/150 |
| 5,811,283 A | 9/1998 | Sun |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidada et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,560,142 B1 | 5/2003 | Ando |
| 6,566,177 B1 | 5/2003 | Radens et al. |
| 6,567,330 B2 | 5/2003 | Fujita et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,897,098 B2 | 5/2005 | Hareland et al. |
| 6,903,984 B1 | 6/2005 | Tang et al. |
| 6,909,151 B2 | 6/2005 | Hareland et al. |
| 6,913,964 B2 | 7/2005 | Hsu |
| 7,061,806 B2 | 6/2006 | Tang et al. |
| 7,230,846 B2 * | 6/2007 | Keshavarzi et al. ......... 365/177 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2004/0108532 A1 | 6/2004 | Forbes |
| 2005/0001269 A1 | 1/2005 | Hayashi et al. |
| 2005/0062088 A1 | 3/2005 | Houston |
| 2005/0064659 A1 | 3/2005 | Willer |
| 2005/0105342 A1 | 5/2005 | Tang et al. |
| 2005/0111255 A1 | 5/2005 | Tang et al. |
| 2005/0135169 A1 | 6/2005 | Somasekhar et al. |
| 2005/0141262 A1 | 6/2005 | Yamada et al. |
| 2005/0141290 A1 | 6/2005 | Tang et al. |

| | | | |
|---|---|---|---|
| 2005/0145886 A1 | 7/2005 | Keshavarzi et al. | |
| 2005/0145935 A1 | 7/2005 | Keshavarzi et al. | |
| 2005/0167751 A1 | 8/2005 | Nakajima et al. | |
| 2005/0189576 A1 | 9/2005 | Ohsawa | |
| 2005/0226070 A1 | 10/2005 | Ohsawa | |
| 2005/0232043 A1 | 10/2005 | Ohsawa | |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | S62-007149 A | 1/1987 |
| JP | 62-272561 | 11/1987 |
| JP | 02-294076 | 2/1991 |
| JP | 03171768 | 7/1991 |
| JP | H04-176163 A | 6/1992 |
| JP | 05-347419 | 12/1993 |
| JP | 08213624 | 8/1996 |
| JP | H08-213624 A | 8/1996 |
| JP | 8-274277 | 10/1996 |
| JP | H08-316337 A | 11/1996 |
| JP | 09046688 | 2/1997 |
| JP | 9-82912 | 3/1997 |
| JP | 10242470 | 11/1998 |
| JP | 11-87649 | 3/1999 |
| JP | 2000-247735 | 8/2000 |
| JP | 2000-389106 | 12/2000 |
| JP | 2001-180633 | 6/2001 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-009081 | 11/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"A Capacitorless Double-Gate DRAM Cell", Kuo et al., IEEE Electron Device Letters, vol. 23, No. 6, Jun. 2002, pp. 345-347.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisms of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22nd International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15µ m SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"A Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+-Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"A High-Speed Clamped Bit-Line Current-Mode Sense Amplifier", T. Blalock, IEEE Journal of Solid-State Circuits, vol. 26, No. 4, Apr. 1991, pp. 542-548.

"Low-Voltage Transient Bipolar Effect Induced by Dynamic Floatlng-Body Charging in PD/SOI MOSFETs", Pelella et al., Final Camera Ready Art, SOI Conference, Oct. 1995, 2 pages.

"Floating-Body Concerns for SOI Dynamic Random Access Memory (DRAM)", Mandelman et al, Proceedings 1996 IEEE International SOI Conference, Oct. 1996, pp. 136-137.

"Simulation of Floating Body Effect in SOI Circuits Using BSIM3SOI", Tu et al., Proceedings of Technical Papers (IEEE Cat No. 97$^{TH}$8303), 1997, pp. 339-342.

Hot-Carrier Effect in Ultra-Thin-Film (UTF) Fully-Depleted SOI MOSFET's, Yu et al., 54$^{th}$ Annual Device Research Conference Digest (Cat. No. 96$^{TH}$8193), 1996, pp. 22-23.

\* cited by examiner

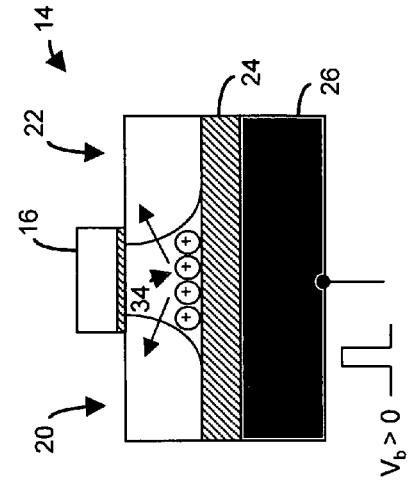
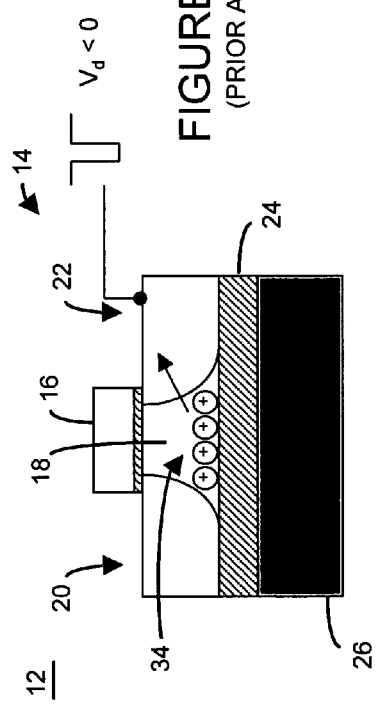
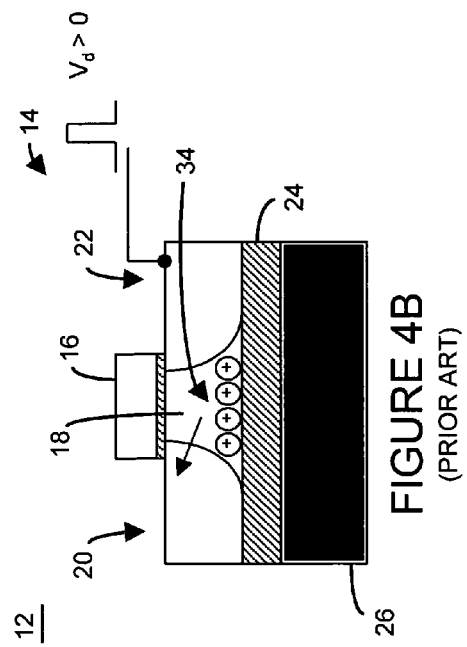
FIGURE 4A (PRIOR ART)
FIGURE 4B (PRIOR ART)
FIGURE 4C (PRIOR ART)

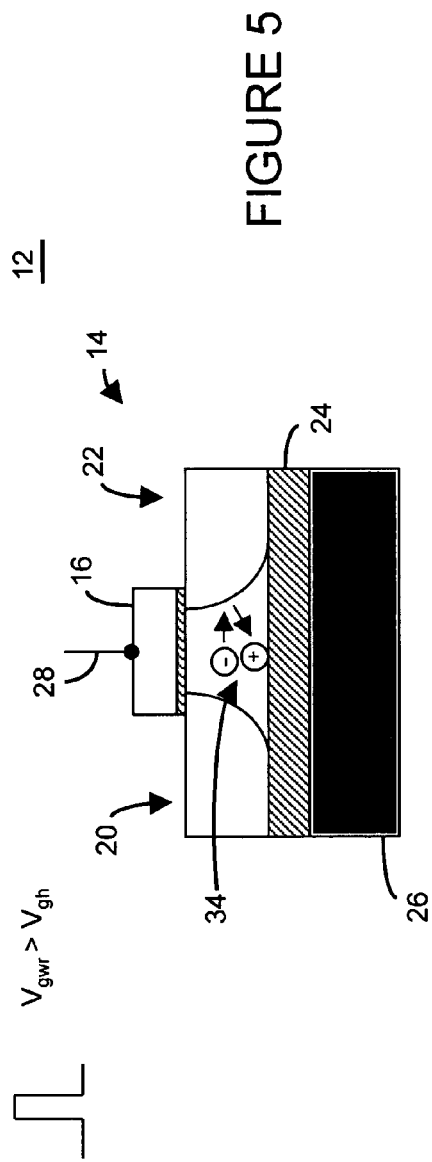
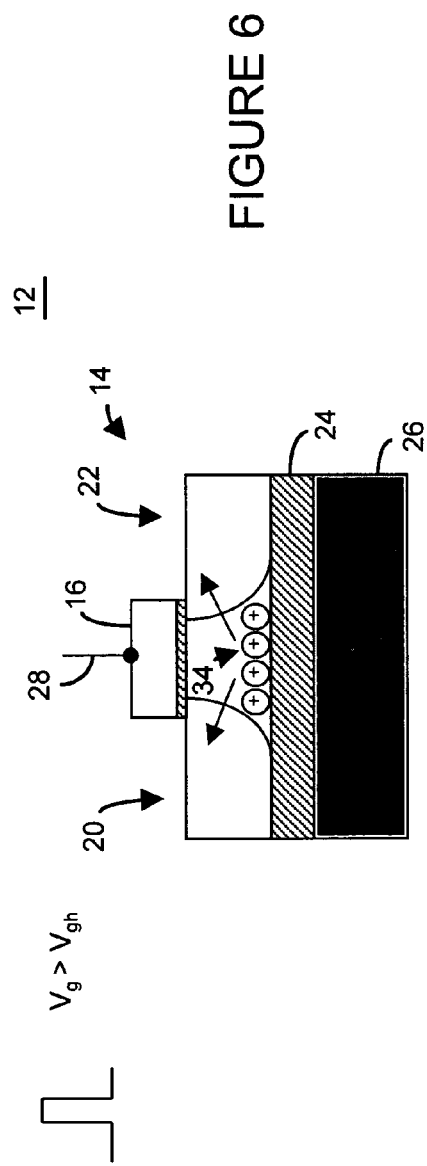

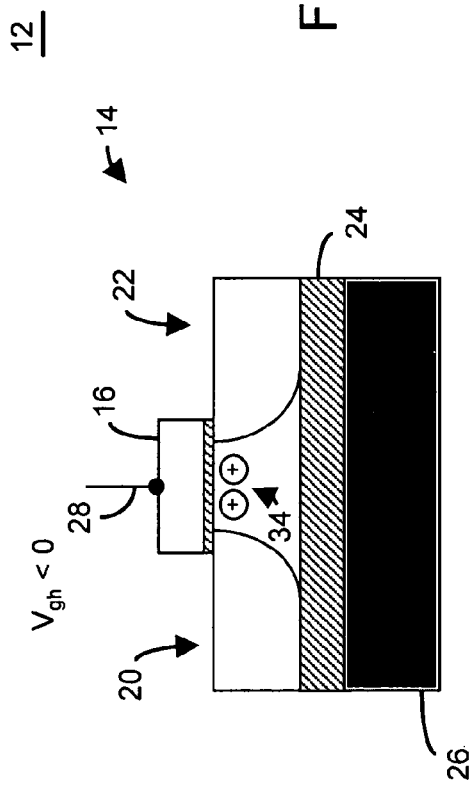
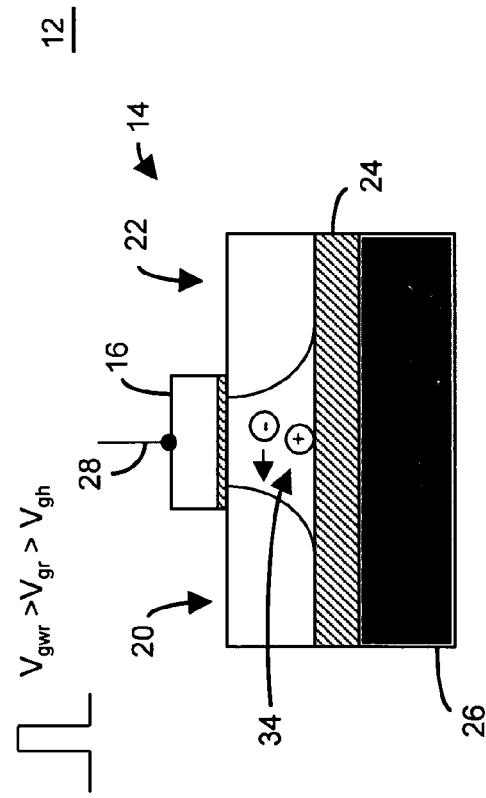

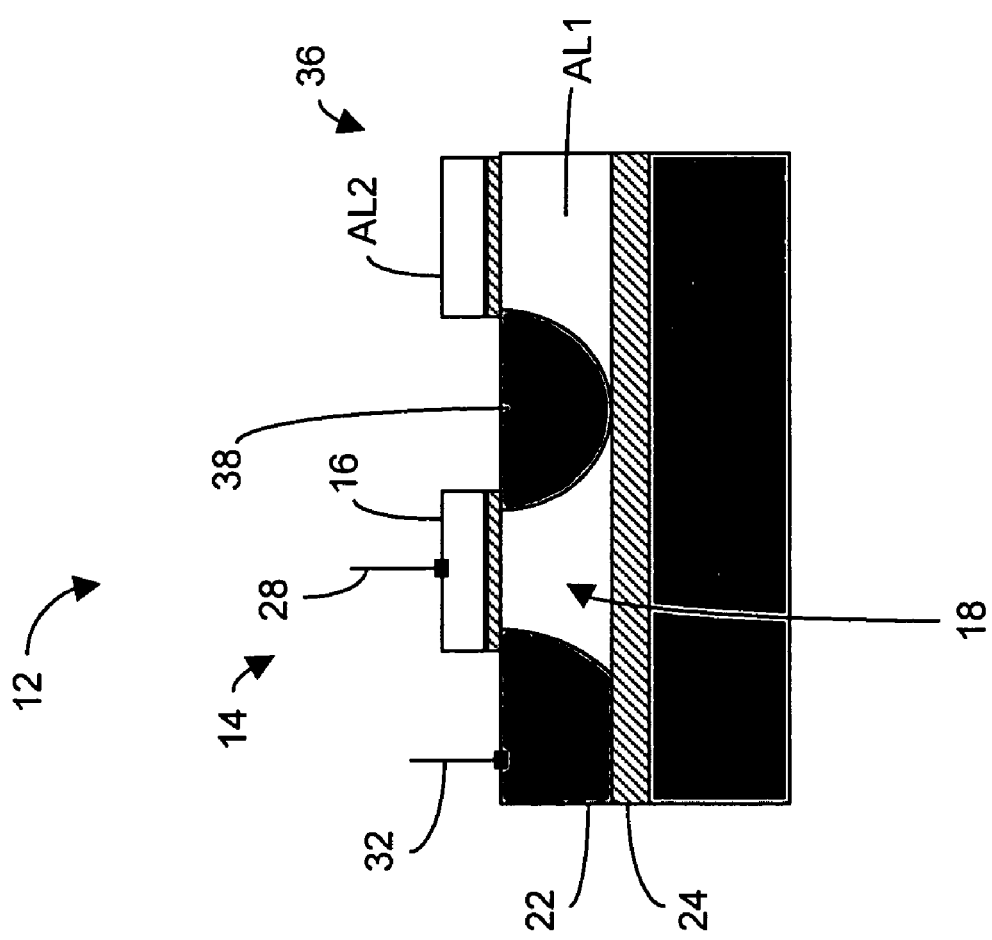

ELECTRICALLY FLOATING BODY MEMORY CELL AND ARRAY, AND METHOD OF OPERATING OR CONTROLLING SAME

RELATED APPLICATION

This application claims priority to U.S. Provisional Application Ser. No. 60/751,505, entitled "Floating Body Memory Cell and Array, and Method of Operating or Controlling Same", filed Dec. 19, 2005; the contents of the provisional application are incorporated by reference herein in its entirety.

BACKGROUND

The inventions relate to a semiconductor memory cell, array, architecture and device, and techniques for reading, controlling and/or operating such cell and device; and more particularly, in one aspect, to a semiconductor dynamic random access memory ("DRAM") cell, array, architecture and/or device wherein the memory cell includes an electrically floating body in which an electrical charge is stored.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors. (See, for example, U.S. Pat. No. 6,969,662, incorporated herein by reference). In this regard, the dynamic random access memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one exemplary embodiment, semiconductor DRAM array 10 includes a plurality of memory cells 12 each consisting of transistor 14 having gate 16, body region 18, which is electrically floating, source region 20 and drain region 22. The gate 16 is disposed on a dielectric material above body region 18. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 patent, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 30 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

Conventional reading is performed by applying a small drain bias and a gate bias above the transistor threshold voltage. The sensed drain current is determined by the charge stored in the floating body giving a possibility to distinguish between the states "1" and "0". A floating body memory device has two different current states corresponding to the two different logical states: "1" and "0".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined/affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In short, conventional writing programming techniques for memory cells having an N-channel type transistor often provide an excess of majority carriers by channel impact ionization (see, FIG. 3A) or by band-to-band tunneling (gate-induced drain leakage "GIDL") (see, FIG. 3B). The majority carrier may be removed via drain side hole removal (see, FIG. 4A), source side hole removal (see, FIG. 4B), or drain and source hole removal, for example, using the back gate pulsing (see, FIG. 4C).

The memory cell 12 having electrically floating body transistor 14 may be programmed/read using other techniques including techniques that may, for example, provide lower power consumption relative to conventional techniques. For example, memory cell 12 may be programmed, read and/or controlled using the techniques and circuitry described and illustrated in U.S. Non-Provisional patent application Ser. No. 11/509,188, filed on Aug. 24, 2006, and entitled "Memory Cell and Memory Cell Array Having an Electrically Floating Body Transistor, and Methods of Operating Same" (hereinafter "the '188 application"), which is incorporated by reference herein. In one aspect, the '188 application is directed to programming, reading and/or control methods which allow low power memory programming and provide larger memory programming window (both relative to at least the conventional programming techniques).

With reference to FIG. 5, in one exemplary embodiment, the '188 application employs, writes or programs a logic "1" or logic high using control signals (having predetermined voltages, for example, Vg=0v, Vs=0v, and Vd=2.5v) which are applied to gate 16, source region 20 and drain region 22 (respectively) of transistor 14 of memory cell 12. Such control signals induce or cause impact ionization and/or the avalanche multiplication phenomenon (FIG. 5). The predetermined voltages of the control signals, in contrast to the conventional method program or write logic "1" in the transistor of the memory cell via impact ionization and/or avalanche multiplication in the electrically floating body. In one embodiment, it is preferred that the bipolar transistor current responsible for impact ionization and/or avalanche multiplication in the floating body is initiated and/or induced by a control pulse which is applied to gate 16. Such a pulse may induce the channel impact ionization which increases the floating body potential and turns on the bipolar current. An advantage of the described method is that larger amount of the excess majority carriers is generated compared to other techniques.

Further, with reference to FIG. 6, when writing or programming logic "0" in transistor 14 of memory cell 12, in one embodiment of the '188 application, the control signals (having predetermined voltages (for example, Vg=1.5v, Vs=0v and Vd=0v) are different and, in at least one embodiment, higher than a holding voltage (if applicable)) are applied to gate 16, source region 20 and drain region 22 (respectively) of transistor 14 of memory cell 12. Such control signals induce or provide removal of majority carriers from the electrically floating body of transistor 14. In one embodiment, the majority carriers are removed, eliminated or ejected from body region 18 through source region 20 and drain region 22. (See, FIG. 6). In this embodiment, writing or programming memory cell 12 with logic "0" may again consume lower power relative to conventional techniques.

When memory cell 12 is implemented in a memory cell array configuration, it may be advantageous to implement a "holding" operation for certain memory cells 12 when programming one or more other memory cells 12 of the memory cell array to enhance the data retention characteristics of such certain memory cells 12. The transistor 14 of memory cell 12 may be placed in a "holding" state via application of control signals (having predetermined voltages) that are applied to gate 16 and source region 20 and drain region 22 of transistor 14 of memory cell 12. In combination, such control signals provide, cause and/or induce majority carrier accumulation in an area that is close to the interface between gate dielectric 32 and electrically floating body region 18. (See, FIG. 7). In this embodiment, it may be preferable to apply a negative voltage to gate 16 where transistor 14 is an N-channel type transistor.

With reference to FIG. 8, in one embodiment of the '188 application, the data state of memory cell 12 may be read and/or determined by applying control signals (having predetermined voltages, for example, Vg=−0.5v, Vs=2.5v and Vd=0v) to gate 16 and source region 20 and drain region 22 of transistor 14. Such signals, in combination, induce and/or cause the bipolar transistor current in those memory cells 12 storing a logic state "1". For those memory cells that are programmed to a logic state "0", such control signals do not induce and/or cause a considerable, substantial or sufficiently measurable bipolar transistor current in the cells programmed to "0" state. (See, the '188 application, which, as noted above, is incorporated by reference).

As mentioned above, the reading may be performed using positive voltages applied to word lines 28. As such, transistors 14 of device 10 are periodically pulsed between a positive gate bias, which (1) drives majority carriers (holes for N-channel transistors) away from the interface between gate insulator 32 and body region 18 of transistor 14 and (2) causes minority carriers (electrons for N-channel transistors) to flow from source region 20 and drain region 22 into a channel formed below gate 16, and the negative gate bias, which causes majority carriers (holes for N-channel transistors) to accumulate in or near the interface between gate 16 and body region 18 of transistor 14.

Notably, conventional programming techniques may employ relatively high drain and/or gate bias voltages, which may increase the power consumption of the memory cell. Moreover, relatively high bias voltages may present device scaling challenges due to the reduction in device features. The proposed memory cell does not require any high voltages and provides a low power and scalable memory.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to a semiconductor memory cell, memory cell array including a plurality of memory cells. In another aspect, the present inventions are directed to techniques for reading, controlling and/or operating, the memory cell and/or memory cell array. Each memory cell includes at least one transistor having an electrically floating body transistor and an active access element. The electrically floating body region of the transistor forms a storage area or node of the memory cell wherein an electrical charge which is representative of a data state is stored in the electrically floating body region. The active access element is coupled to the electrically floating body transistor to facilitate programming of the memory cell and to provide a relatively large amount of majority carriers to the storage area or node of the memory cell during a write operation. The memory cell and/or memory cell array of the present inventions may be incorporated in an integrated circuit device, for example, a logic device (such as, for example, a microcontroller or microprocessor) or may comprise a portion of a memory device (such as, for example, a discrete memory).

In another aspect, the present inventions are directed to an integrated circuit, disposed in or on a semiconductor region or layer which resides on or above a non-conducting region or layer of a substrate (for example, a bulk-type substrate (for example, silicon) or a semiconductor-on-insulator substrate), the integrated circuit comprises a semiconductor memory cell including (1) an active access element, electrically coupled to the transistor, including a first access line or region, a second access line or region, and a control node (for example, a region), and (2) a transistor including: (i) a first semiconductor region including impurities to provide a first conductivity type, (ii) a second semiconductor region including impurities to provide the first conductivity type, and (iii) a body region disposed between the first region, the second region and the non-conducting region or layer of the substrate, wherein the body region is electrically floating and includes impurities to provide a second conductivity type wherein the second conductivity type is different from the first conductivity type. The transistor also includes a gate spaced apart from the body region.

The memory cell includes a first data state which corresponds to a first charge in the body region of the transistor of the memory cell, and (ii) a second data state which corresponds to a second charge in the body region of the transistor of the memory cell.

In an exemplary embodiment, the first access line is a semiconductor region including impurities to provide the second conductivity type. In another exemplary embodiment, the first access line is a semiconductor region having a conductivity type which is different from the first conductivity type. The second access line may be a semiconductor material (for example, a doped semiconductor material) or metal material.

In an exemplary embodiment, the control node of the active access element and the second semiconductor region of the transistor are a common region. In another embodiment, the active access element further includes a dielectric, disposed between the first access line/region and the second access line/region.

In another aspect, the present inventions are directed to an integrated circuit, disposed in or on a semiconductor region or layer which resides on or above a non-conducting region or layer of a substrate (for example, a bulk-type substrate (for example, silicon) or a semiconductor-on-insulator substrate), the integrated circuit comprises a plurality of semiconductor memory cells arranged in a matrix of rows and columns, each semiconductor memory cell includes a transistor and an active access element, wherein the transistor is electrically coupled to the active access element. The active access element includes a first access line or region, a second access line or region and a control node (for example, a region). The transistor includes (i) a first semiconductor region including impurities to provide a first conductivity type, (ii) a second semiconductor region including impurities to provide the first conductivity type, and (iii) a body region disposed between the first region, the second region and the non-conducting region or layer of the substrate, wherein the body region is electrically floating and includes impurities to provide a second conductivity type wherein the second conductivity type is different from the first conductivity type. The transistor also includes a gate spaced apart from the body region.

Each memory cell includes a first data state which corresponds to a first charge in the body region of the transistor of the memory cell, and (ii) a second data state which corresponds to a second charge in the body region of the transistor of the memory cell.

In an exemplary embodiment, the first access line is a semiconductor region including impurities to provide the second conductivity type. In another exemplary embodiment, the first access line is a semiconductor region having a conductivity type which is different from the first conductivity type. The second access line may be a semiconductor material (for example, a doped semiconductor material) or metal material.

In an exemplary embodiment, two adjacent memory cells share an active access element; in another embodiment, two adjacent memory cells share at least a portion of the first access line or region of the associated active access element.

In an exemplary embodiment, the control node of the active access element and the second semiconductor region of the transistor are a common region. In another embodiment, the active access element further includes a dielectric, disposed between the first access line and the second access line.

In another aspect, the present inventions are directed to an integrated circuit device comprising a memory cell array including a plurality of word lines, plurality of bit lines, a plurality of first access lines, and a plurality of second access lines. The integrated circuit further includes a plurality of semiconductor memory cells arranged in a matrix of rows and columns, each semiconductor memory cell includes a transistor and an active access element, wherein the transistor is electrically coupled to the active access element. The active access element includes a first access region (electrically coupled to the first access line), a second access region (electrically coupled to the second access line) and a control node (for example, a region). The transistor includes (i) a first semiconductor region electrically coupled to an associated bit line and including impurities to provide a first conductivity type, (ii) a second semiconductor region including impurities to provide the first conductivity type, and (iii) a body region disposed between the first region, the second region and the non-conducting region or layer of the substrate, wherein the body region is electrically floating and includes impurities to provide a second conductivity type wherein the second conductivity type is different from the first conductivity type. The transistor also includes a gate electrically coupled to an associated word line and spaced apart from the body region.

Each memory cell includes a first data state which corresponds to a first charge in the body region of the transistor of the memory cell, and (ii) a second data state which corresponds to a second charge in the body region of the transistor of the memory cell.

In an exemplary embodiment, the first access line is a semiconductor region including impurities to provide the second conductivity type. In another exemplary embodiment, the first access line is a semiconductor region having a conductivity type which is different from the first conductivity type. The second access line may be a semiconductor material (for example, a doped semiconductor material) or metal material.

In an exemplary embodiment, two adjacent memory cells share an active access element; in another embodiment, two adjacent memory cells share at least a portion of the first access line or region of the associated active access element. Indeed, in another embodiment, the first semiconductor region of the transistors of the two adjacent memory cells are connected to the same bit line.

In an exemplary embodiment, the control node of the active access element and the second semiconductor region of the transistor are a common region. In another exemplary embodiment, the active access element further includes a dielectric, disposed between the first access line and the second access line.

Again, there are many inventions, and aspects of the inventions, described and illustrated herein. This Summary of the Inventions is neither exhaustive of the scope of the present inventions nor is it representative of the scope of the claims. This Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many other embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures may be labeled similarly. It is understood that various combinations of the structures, components, materials and/or elements, other than those specifically shown, are contemplated and are within the scope of the present inventions.

Moreover, as noted above, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIGS. 4A-4C are exemplary schematics and general illustrations of conventional methods to program a memory cell to logic state "0" (i.e., provide relatively fewer majority carrier by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor via using the back gate pulses applied to the substrate/backside terminal of the transistor of the memory cell (FIG. 4C);

FIG. 5 illustrates an exemplary schematic (and control signal voltage relationship) of an exemplary embodiment of an aspect of the '188 application of programming a memory cell to logic state "1" by generating, storing and/or providing an excess of majority carriers in the electrically floating body of the transistor of the memory cell;

FIG. 6 illustrates an exemplary schematic (and control signals) of an exemplary embodiment of an aspect of the '188 application of programming a memory cell to a logic state "0" by generating, storing and/or providing relatively fewer majority carriers (as compared to the number of majority carriers in the electrically floating body of the memory cell that is programmed to a logic state "1") in the electrically floating body of the transistor of the memory cell, wherein the majority carriers are removed (write "0") through both drain and source terminals by applying a control signal (for example, a programming pulse) to the gate of the transistor of the memory cell;

FIG. 7 illustrates an exemplary schematic (and control signals) of an exemplary embodiment of an aspect of the '188 application of holding or maintaining the data state of a memory cell;

FIG. 8 illustrates an exemplary schematic (and control signals) of an exemplary embodiment of an aspect of the '188 application of reading the data state of a memory cell by sensing the amount of the current provided/generated in response to an application of a predetermined voltage on the gate of the transistor of the memory cell;

FIG. 9A is a cross-sectional schematic view of a memory cell according to aspects of the present inventions wherein the memory cell includes an active access element and transistor having an electrically floating body;

FIGS. 9B and 9C are cross-sectional schematic views of two adjacent memory cells according to aspects of the present inventions wherein the active access element is shared between the adjacent memory cells, wherein FIG. 9B is a cross-sectional schematic view of two adjacent N-channel type memory cells and FIG. 9C is a cross-sectional schematic view of two adjacent P-channel type memory cells;

DETAILED DESCRIPTION

Figure 1A:
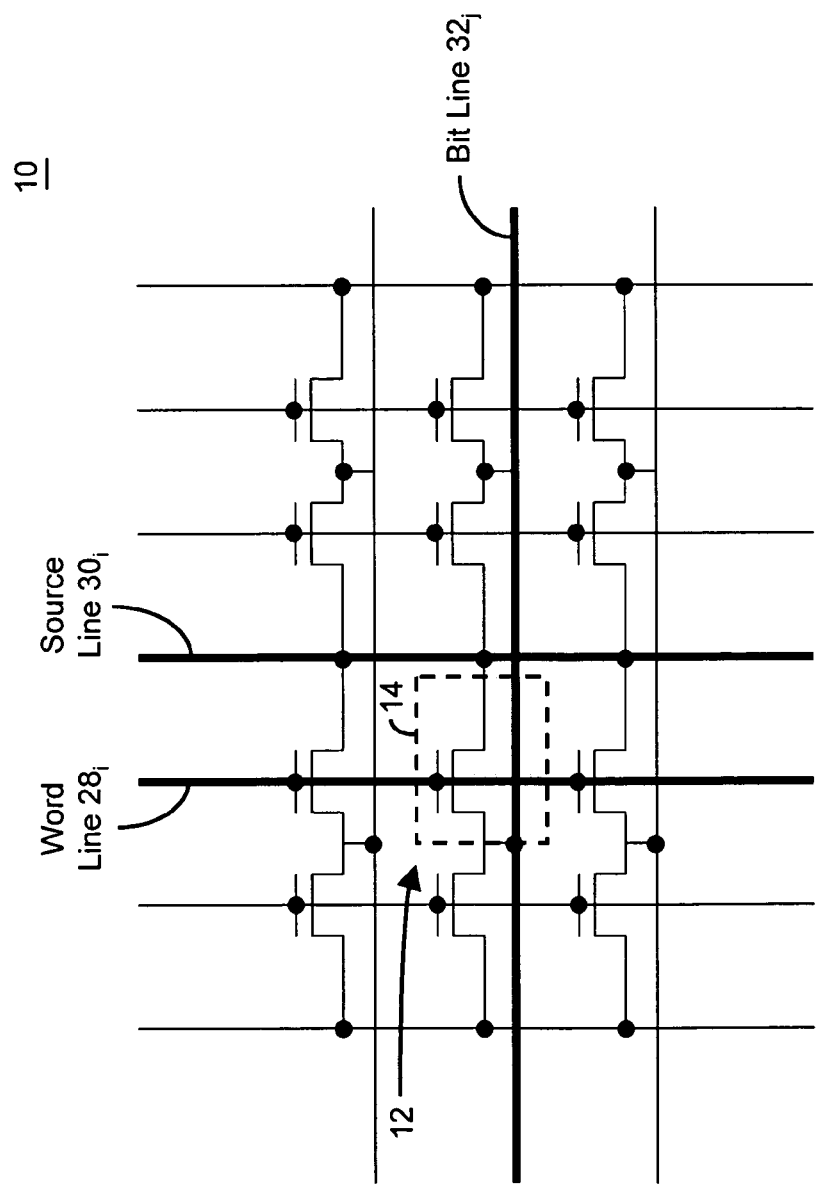
FIG. 1A is a schematic representation of a prior art DRAM array including a plurality of memory cells comprised of one electrically floating body transistor.
Figure 1B:
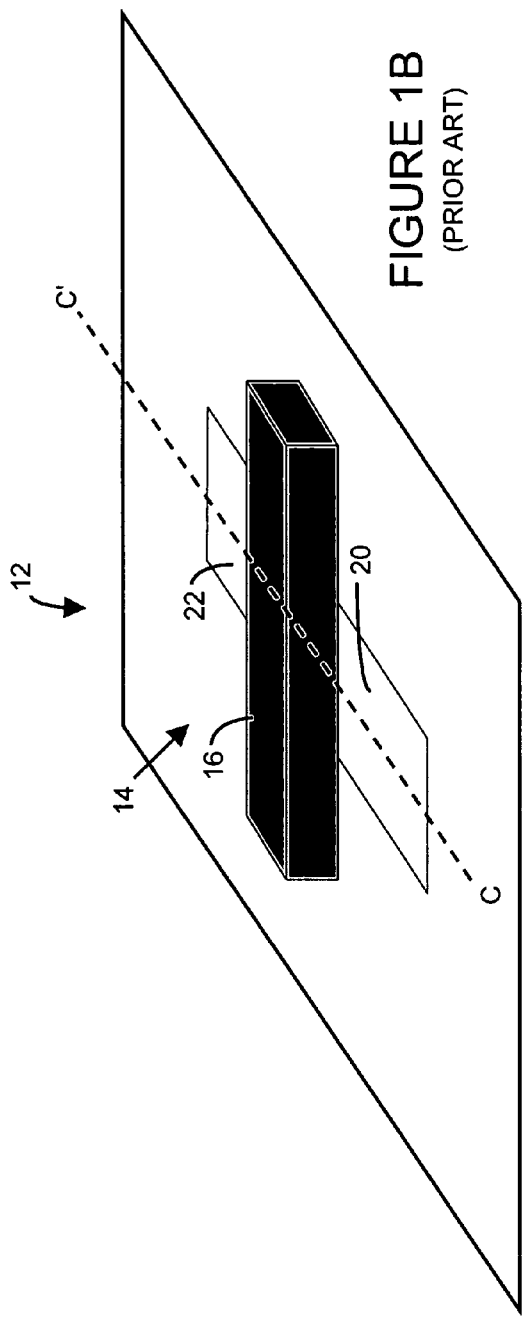
FIG. 1B is a three dimensional view of an exemplary prior art memory cell comprised of one electrically floating body transistor (PD-SOI NMOS)
Figure 1C:
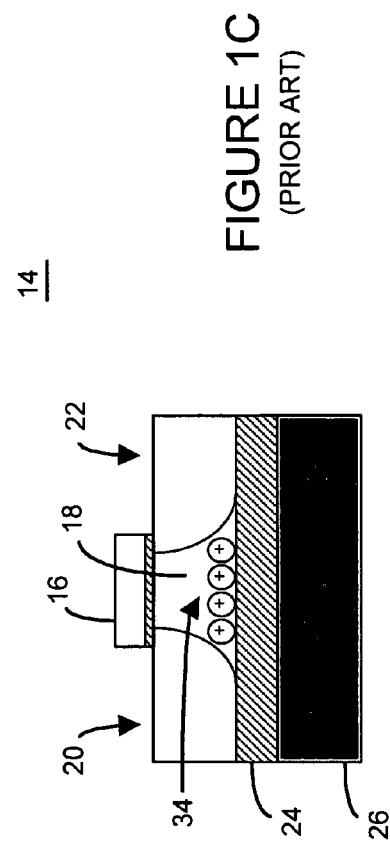
FIG. 1C is a cross-sectional view of the prior art memory cell of FIG. 1B, cross-sectioned along line C-C'.
Figure 2A:
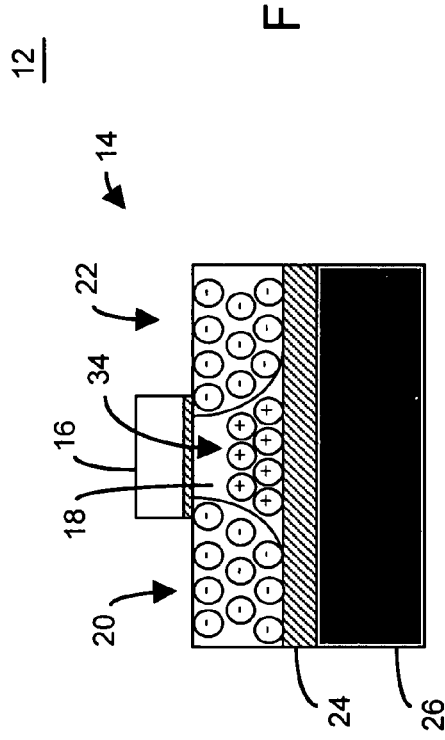
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
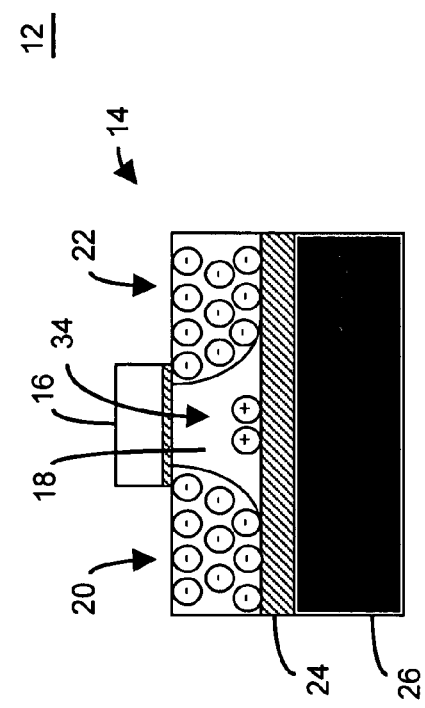
Figure 3A:
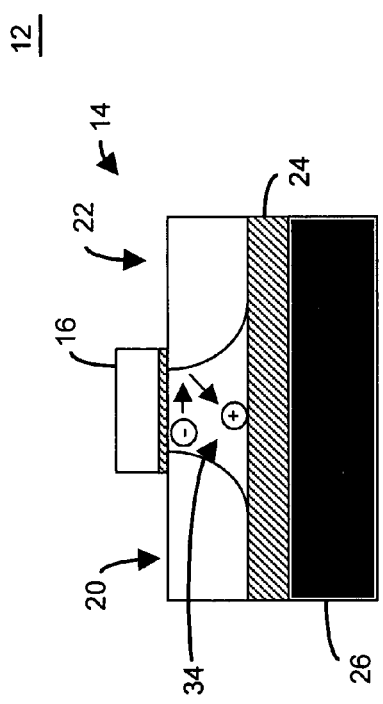
FIGS. 3A and 3B are exemplary schematic and general illustrations of conventional methods to program a memory cell to logic state "1" (i.e., generate or provide an excess of majority carrier in the electrically floating body of the transistor (an N-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B)
Figure 3B:
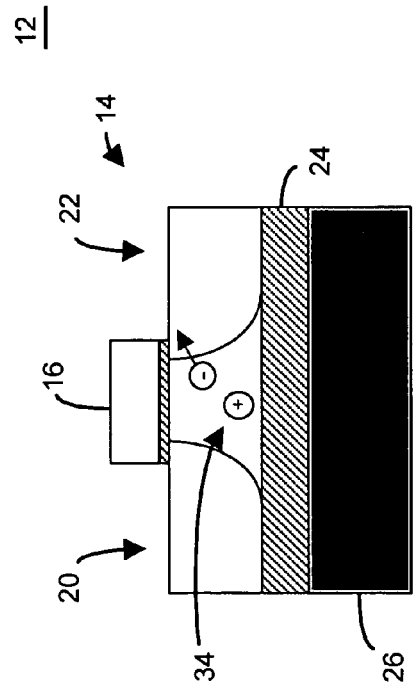

The present inventions describe a semiconductor memory cell, memory cell array, and techniques for reading, controlling and/or operating, the memory cell, and/or array. Each memory cell includes at least one transistor having an electrically floating body transistor and an active access element. The electrically floating body region of the transistor forms a storage area or node of the memory cell wherein an electrical charge which is representative of a data state is stored in the electrically floating body region. The active access element is coupled to the electrically floating body transistor to facilitate programming of the memory cell and to provide a relatively large amount of majority carriers to the storage area or node of the memory cell during a write operation. Notably, the memory cell and/or memory cell array of the present inventions may be incorporated in an integrated circuit device, for example, a logic device (such as, for example, a microcontroller or microprocessor) or may comprise a portion of a memory device (such as, for example, a discrete memory).

With reference to FIG. 9A, in one exemplary embodiment, the present inventions are directed to memory cell 12 having (i) electrically floating body transistor 14 to store a charge which is representative of a data state of memory cell 12, and (ii) active access element 36 which facilitates programming of memory cell 12 during a write operation. In this embodiment, transistor 14 includes gate 16, body region 18, which is electrically floating, drain region 22 and control node 38. The gate 16 is disposed on a dielectric material above body region 18. The body region 18 is disposed between drain region 22 and control node 38. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

The gate 16 is electrically coupled to word line 28, and drain region 22 is electrically coupled to bit line 32. Notably, transistor 14 may be an N-channel or P-channel type of transistor.

In one exemplary embodiment, the active access element 36 facilitates programming of memory cell 12. The active access element 36 provides and/or injects majority carriers into electrically floating body region 18 of transistor 14 during a write operation of memory cell 12. The active access element 36 includes access regions and/or lines AL1 and AL2 (hereinafter collectively "access lines"). In addition, in this embodiment, active access element 36 further includes a dielectric material disposed between the first and second access lines AL1 and AL2, respectively.

Moreover, in operation, active access element 36 further includes control node 38. Notably, access line AL1 may be an N-type, a P-type or an intrinsic semiconductor region. The access line AL2 may be a semiconductor region (for example, monocrystalline or polycrystalline silicon, preferably doped) and/or a highly conductive material such as a metal or metal-like material, for example, aluminum, copper, or gold, and/or materials including aluminum, copper, or gold.

In one exemplary embodiment, memory cell 12 includes an N-channel type transistor 14 and active access element 36 having access line AL1 which is a P-type semiconductor region. In another embodiment, memory cell 12 includes a P-channel type transistor 14 and active access element 36 having access line AL1 which is an N-type semiconductor region. In yet another exemplary embodiment, memory cell 12 may include an N-channel type or P-channel type transistor 14 and active access element 36 having access line AL1 which is an intrinsic semiconductor region.

Figure 9B:
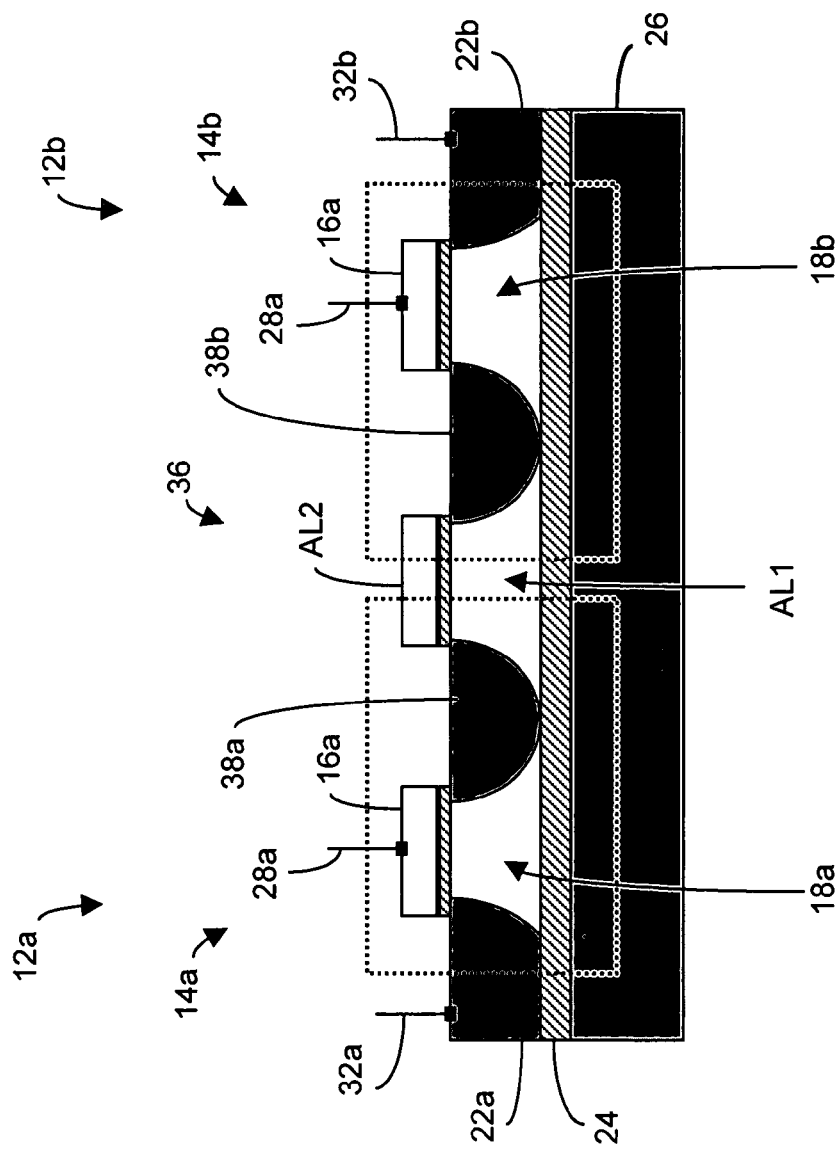
Figure 10:
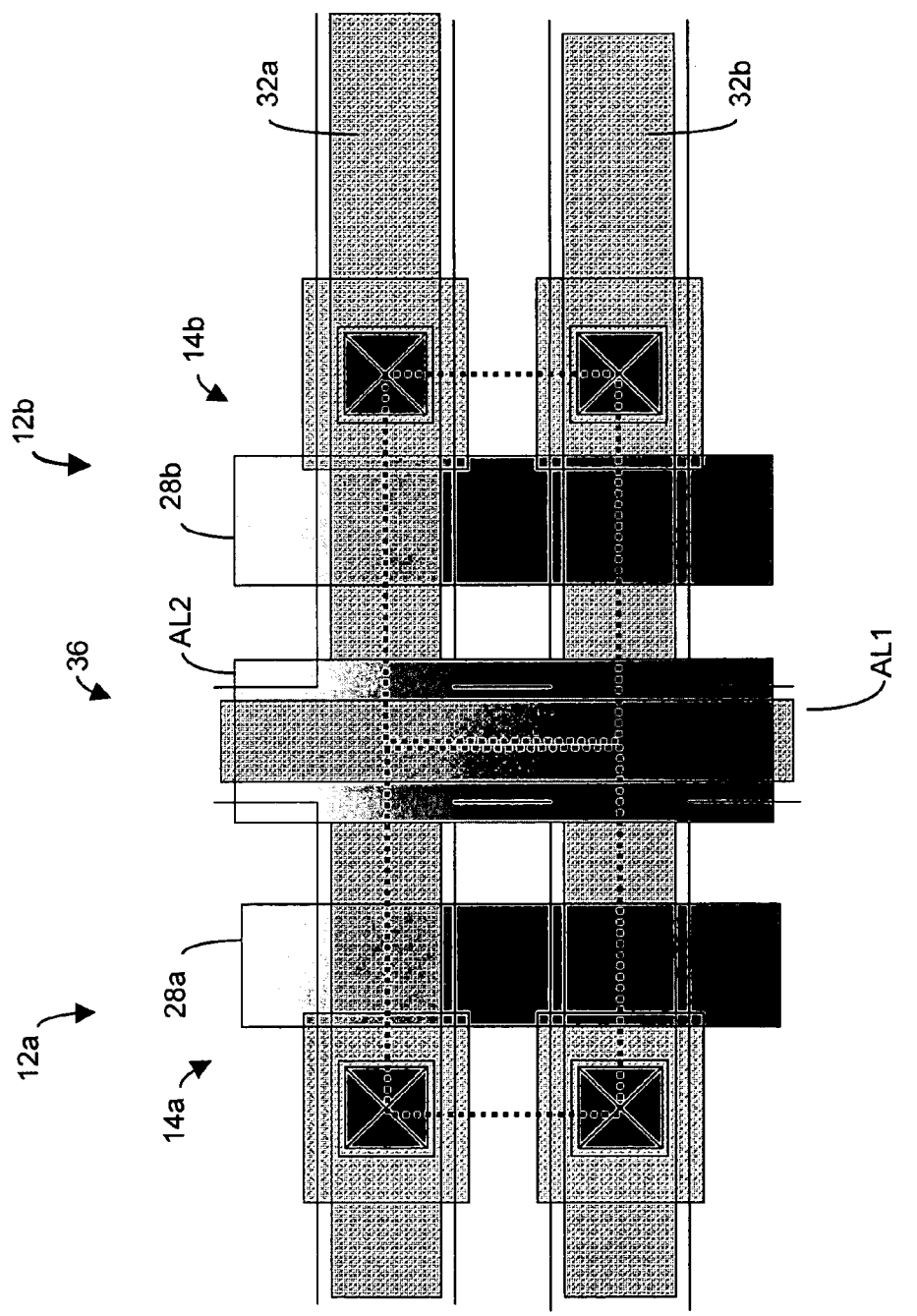
FIG. 10 illustrates an exemplary layout of the memory cells of FIGS. 9B and 9C, notably, access line 1 (AL1) and access line 2 (AL2) may be formed from a semiconductor (for example, monocrystalline or polycrystalline silicon (preferably doped), and/or a highly conductive material such as a metal or metal-like material, for example, aluminum, copper, or gold, and/or materials including aluminum, silver, tungsten, copper, and/or gold) according to at least one of the embodiments of the present inventions.

Notably, with reference to FIGS. 9A and 10, in a memory cell array configuration/environment, the access regions of active access element 36 may be portions of access lines AL1 and AL2 which interact with the associated transistor 14. Alternatively, access lines AL1 and AL2 may electrically connect the access regions of active access element 36 (in a manner similar to a word line 28 connecting to a gate of a transistor 16). As noted above, the access regions and/or lines AL1 and AL2 of an active access element 36 are collectively identified "access lines" unless such aspect(s) of the active access element are/is stated as an "access region".

Figure 11A:
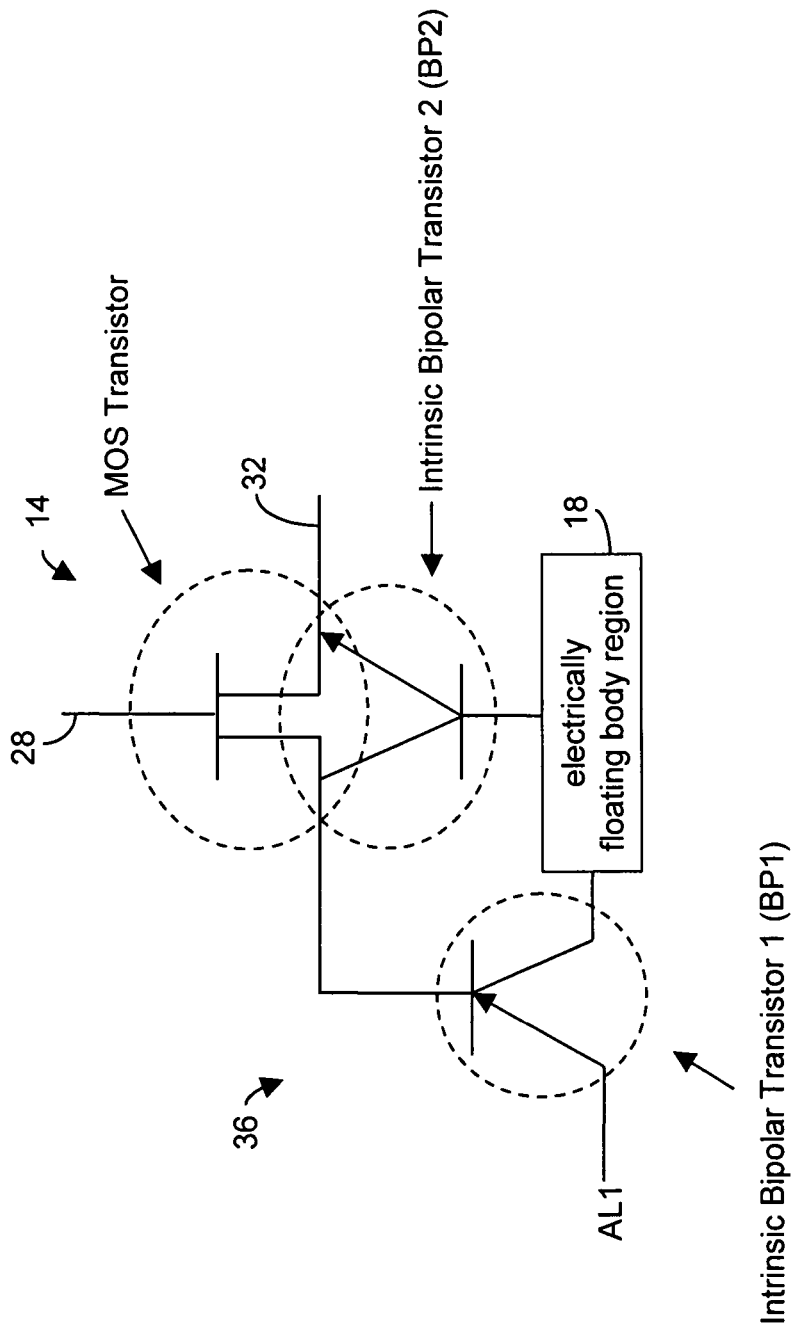
FIG. 11A is a schematic representation of an equivalent electrically floating body memory cell (N-channel type) including intrinsic bipolar transistors in addition to a MOS transistor.
Figure 11B:
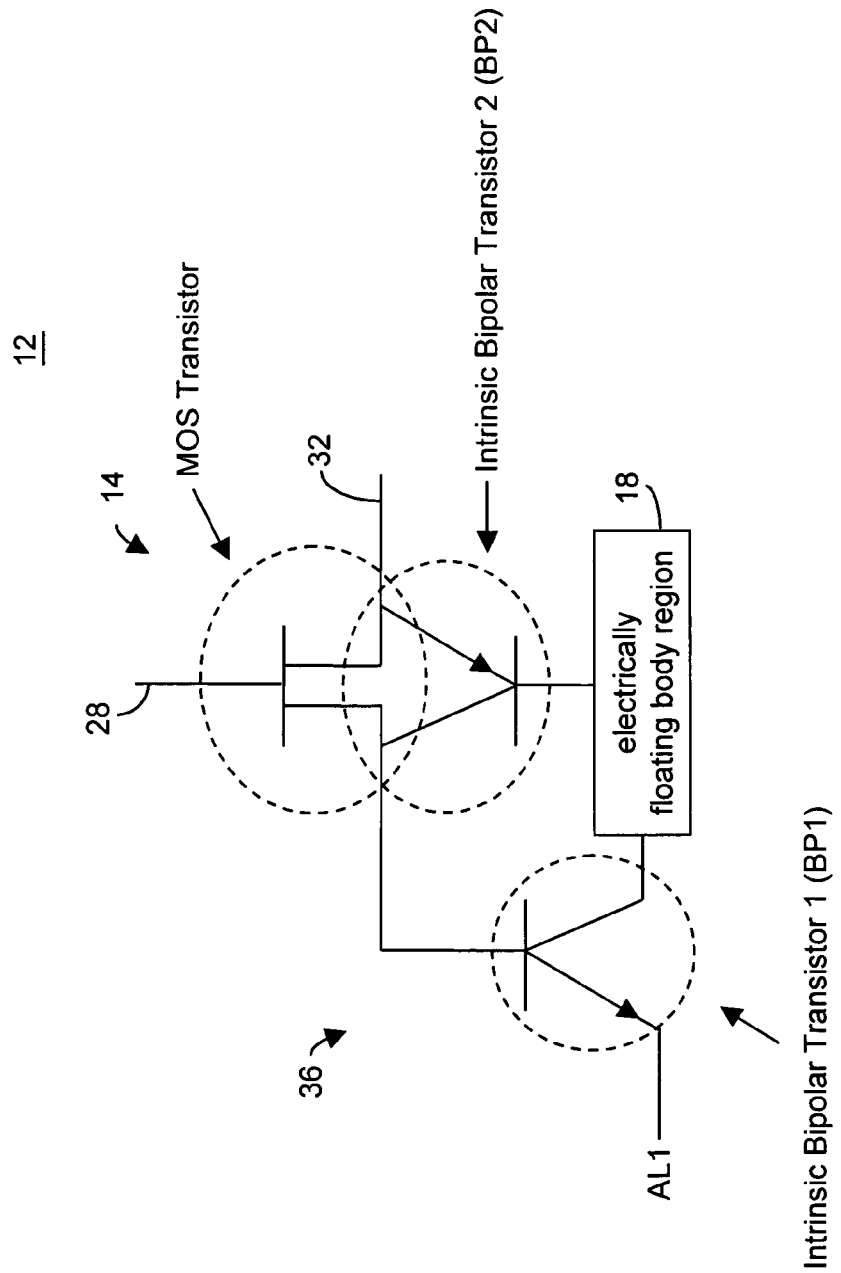
FIG. 11B is a schematic representation of an equivalent electrically floating body memory cell (P-channel type) including intrinsic bipolar transistors in addition to a MOS transistor.
Figure 12:
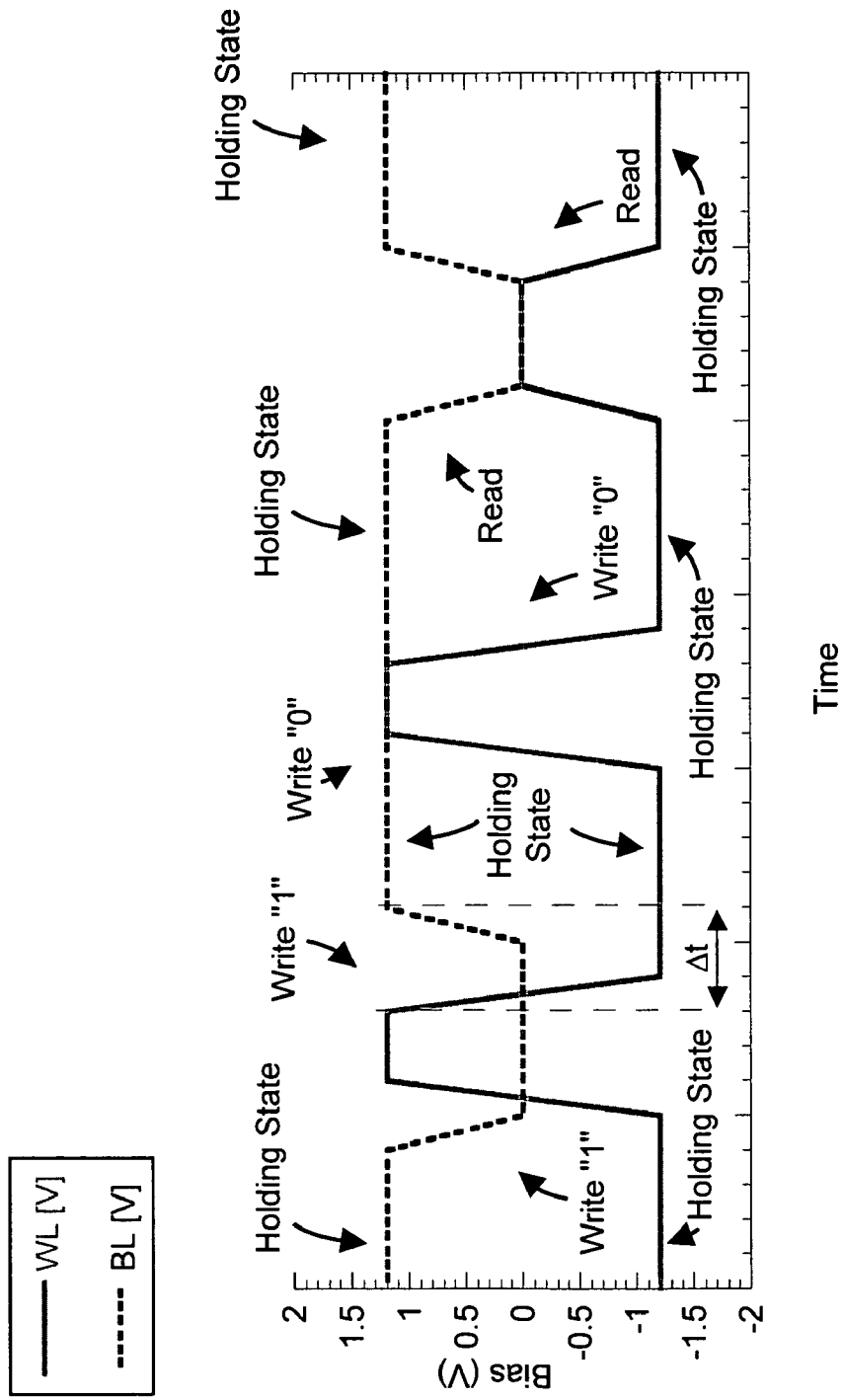
FIG. 12 illustrates exemplary timing relationships of selected write control signals to (i) program or write a logic state "1" into one or more N-channel type memory cells, (ii) program or write logic state "0" into one or more N-channel type memory cells, and (iii) read one or more N-channel type memory cells according to one embodiment of the present inventions.

With reference to FIGS. 9A, 11A and 12, control signals each having a predetermined amplitude may be selectively applied to memory cell 12 to write logic state "1", write logic state "0", and read the data state of memory cell 12. In particular, during a given memory operation, signals are applied to (i) gate 16 and drain region 22 of electrically floating body transistor 14 (via word line 18 and bit line 32, respectively), and (ii) access line AL1 and access line AL2 of active access element 36 in order to write a data in memory cell 12 or read the data stored in memory cell 12. For example, in one exemplary embodiment to write logic state "1" into memory cell 12 which includes an N-channel type transistor 14 and active access element 36 having access line AL1 which is a P-type semiconductor region, a control signal having a voltage of +1.2V is applied to access line AL1 and a control signal having a voltage of 0V is applied to Access Line AL2. In this way, the logic state written into memory cell 12 may be determined via application of suitable control signals to gate 16 (via word line 28) and drain region 22 (via bit line 32).

In particular, in this exemplary embodiment, a logic state "1" may be programmed or written in memory cell 12 by applying a voltage pulse of +1.2V to gate 16 of transistor 14 and 0V to drain region 22 of transistor 14. Under these conditions, a MOS transistor component of transistor 14 of memory cell 12 is "on" (or substantially "on") and the voltage of control node 38 is equal to (or substantially equal to) the voltage applied to drain region 22 (via bit line 32). Moreover, an intrinsic bipolar transistor 1 (BP1) is also "on" and the majority carriers (in this example, holes) flow to electrically floating body region 18 (the storage node of memory cell 12). Notably, intrinsic bipolar transistor 1 is formed by access lines AL1 and AL2 and control node 38.

Thereafter, the amplitude of the control signal applied to gate 16 (via word line 28) is reduced to a "holding" condition or value (in this example, −1.2V) and the amplitude of the control signal applied to drain region 22 is increased to a "holding" condition or value (in this example, +1.2V). In a preferred embodiment, the amplitude of the control signal applied to gate 16 is reduced to a holding condition or value (−1.2V) after the control signal applied to drain region 22 is increased to a holding condition or value (+1.2V). As such, with reference to FIG. 12, the time interval $\Delta t$ is greater than zero.

Notably, the bit line control signal may be applied to drain region 22 before the word line control signal is applied to gate 16, simultaneously thereto, or after the pulse is applied to gate 16 of transistor 14 of memory cell 12. It is preferred that the pulse applied to drain region 22 (via bit line 32) includes an amplitude which is sufficient to maintain a bipolar current to program, write or store a logic state "1" into memory cell 12. As mentioned above, from a relative timing perspective, it is preferred that the bit line control signal (which is applied to drain region 22) extend beyond when the control signal applied to the word line (WL) reduces or ceases, as illustrated in FIG. 6.

With continued reference to FIGS. 9A, 11A and 12, in this exemplary embodiment, a control signal having a voltage of +1.2V is again applied to access line AL1 and a control signal having a voltage of 0V is again applied to Access Line AL2. As noted above, under these conditions, the logic state written into memory cell 12 may be determined via application of suitable control signals to gate 16 (via word line 28) and drain region 22 (via bit line 32). As such, control signals having predetermined amplitudes may be applied to memory cell 12 to write, program or store logic state "0" therein. In this regard, the word line control signal applied to gate 16 of transistor 14 is raised to +1.2V and the bit line control signal applied to drain region 22 is +1.2V. Under these conditions, the potential of storage area or node of memory cell 12a increases to a state whereby majority carriers are ejected, removed and/or forced from electrically floating body region 18 (the storage area or node of memory cell 12) of transistor 14.

With reference to FIGS. 9A and 12, in one exemplary embodiment, memory cell 12 may be placed or maintained in a standby condition or state (or in a "holding" condition or state), by applying a positive voltage (for example, +1.2V) to drain region 22 of transistor 14 and a negative voltage (for example, −1.2V) to gate 16 (via word line 28). Under these conditions, the data state of the memory cell is relatively undisturbed during, for example, access of memory cells that are adjacent and/or are connected to the same word line 28, bit line 32, and/or access lines AL1 and AL2. Thus, the holding condition or state may be applied or established to prevent, minimize or avoid disturbance of the data state of, and/or the charge contained in the storage area or node (electrically floating body region of the transistor) in an "unselected" memory cell.

With reference to FIGS. 9A, 11A and 12, in one exemplary embodiment, the data state of memory cell 12 may be read, sensed, sampled and/or determined by applying control signals having predetermined amplitudes to gate 16 (via word line 28) and drain region 22 (via bit line 32) of transistor 14. In one exemplary embodiment, a read operation is implemented by applying (i) a signal having a voltage that is higher than the amplitude of the holding level (for example, −1.2V) to gate 16 and (2) a signal having a voltage that is lower than the amplitude of the holding level (for example, +1.2V) to drain region 22. For example, memory cell 12 may be read by applying 0 V to gate 16 and drain region 22 of transistor 14. Under these conditions the bipolar transistor BP2 is "on" or substantially "on" in the event that memory cell 12 stores a "1" data state and the bipolar transistor BP2 is "off" or substantially "off" (relative to when memory cell 12 stores a "1" data state) in the event that memory cell 12a is in "0" data state. In this regard, the current output by memory cell 12 varies depending on whether memory cell 12 stores a logic state "1" or state "0". As discussed below, data sensing circuitry, including, for example, a current sense amplifier, may be used to measure the current and to identify the state of the memory cell.

The illustrated/exemplary voltage levels to implement the write and read operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

As noted above, the present inventions may include a memory cell array including a plurality of memory cells wherein each memory cell includes (i) an electrically floating body transistor to store a charge which is representative of a data state of the memory cell, and (ii) an active access element. For example, with reference to FIGS. 9B and 9C, in one exemplary embodiment, the present inventions include a memory cell, having electrically floating body transistor (an N-channel type in the illustrative embodiment of FIG. 9B, and a P-channel type in the illustrative embodiment of FIG. 9C) to store a charge which is representative of a data state of the memory cell. The active access element 36 includes access lines AL1 and AL2 to provide input signals, as discussed above, into the memory cells to control, in conjunction or combination with other control signals, the memory cells (for example, the write operation (and the data state stored in the memory cell) and the read operation). In this exemplary embodiment, the access lines are shared between two adjacent memory cells.

Figure 9C:
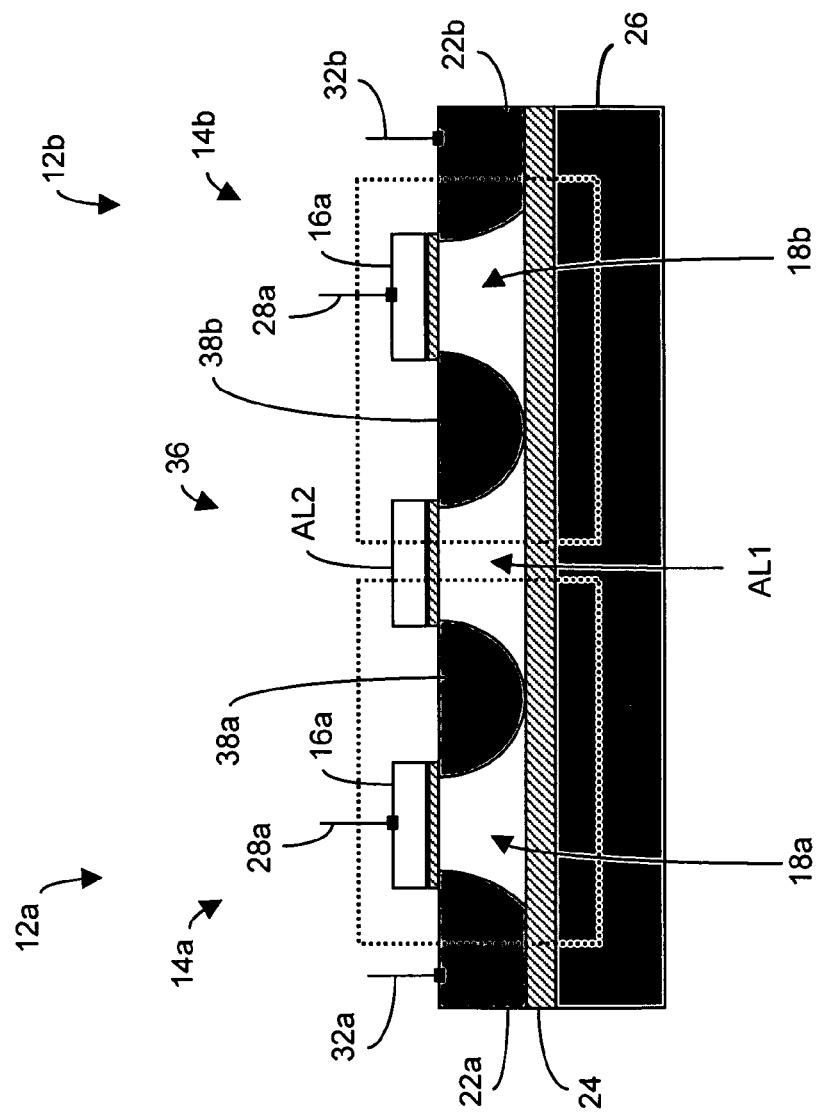

Notably, with reference to FIG. 9C, in the context of controlling a P-type transistor 14 and N-type active access element 36, the polarity of the voltages of the control signals discussed above in the context of FIG. 9A may be reversed. However, the illustrated/exemplary voltage levels to implement the write and read operations are merely exemplary. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

An exemplary layout of the memory cells of FIGS. 9B and 9C is illustrated in FIG. 10. The layout of FIG. 10 is a relatively compact in that adjacent memory cells share an active access element. All layouts, whether now known or later developed, for implementing the present inventions are intended to fall within the scope of the present inventions.

Figure 13A:
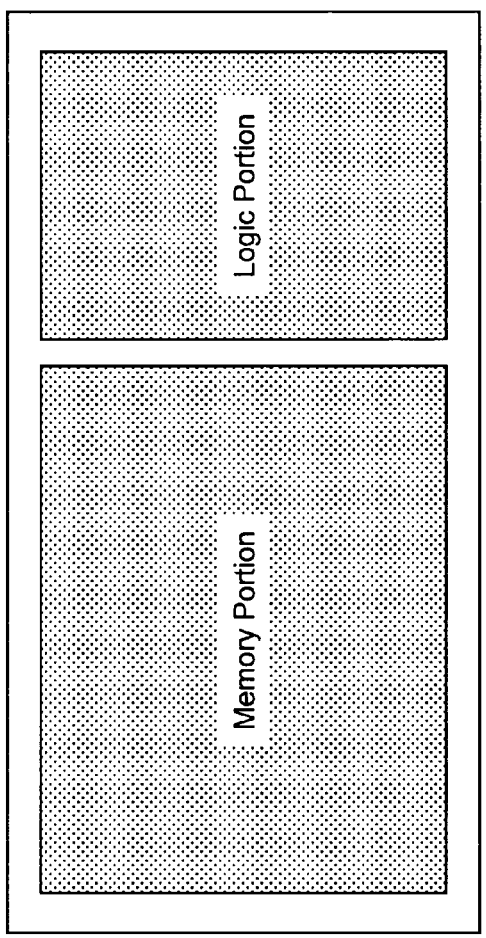
FIGS. 13A and 13B are schematic block diagram illustrations of exemplary integrated circuit devices in which the memory cell array (and certain peripheral circuitry) may be implemented, according to certain aspects of the present inventions.
Figure 13B:
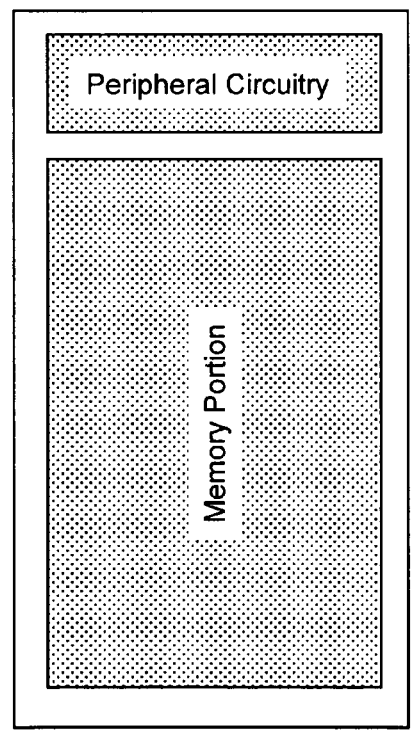

As mentioned above, the present inventions may be implemented in any electrically floating body memory cell 12, plurality of memory cells 12 and memory cell array. For example, a plurality of memory cells 12 of the present inventions may be implemented in a memory array having, for example, a plurality of rows and columns (for example, in a matrix form). The memory cells and memory cell array of the present inventions may be implemented in an integrated circuit device having a memory portion and a logic portion (see, for example, FIG. 13A), or an integrated circuit device that is primarily a memory device (see, for example, FIG. 13B). The memory array may include a plurality of memory cells arranged in a plurality of rows and columns wherein each memory cell includes an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 14:
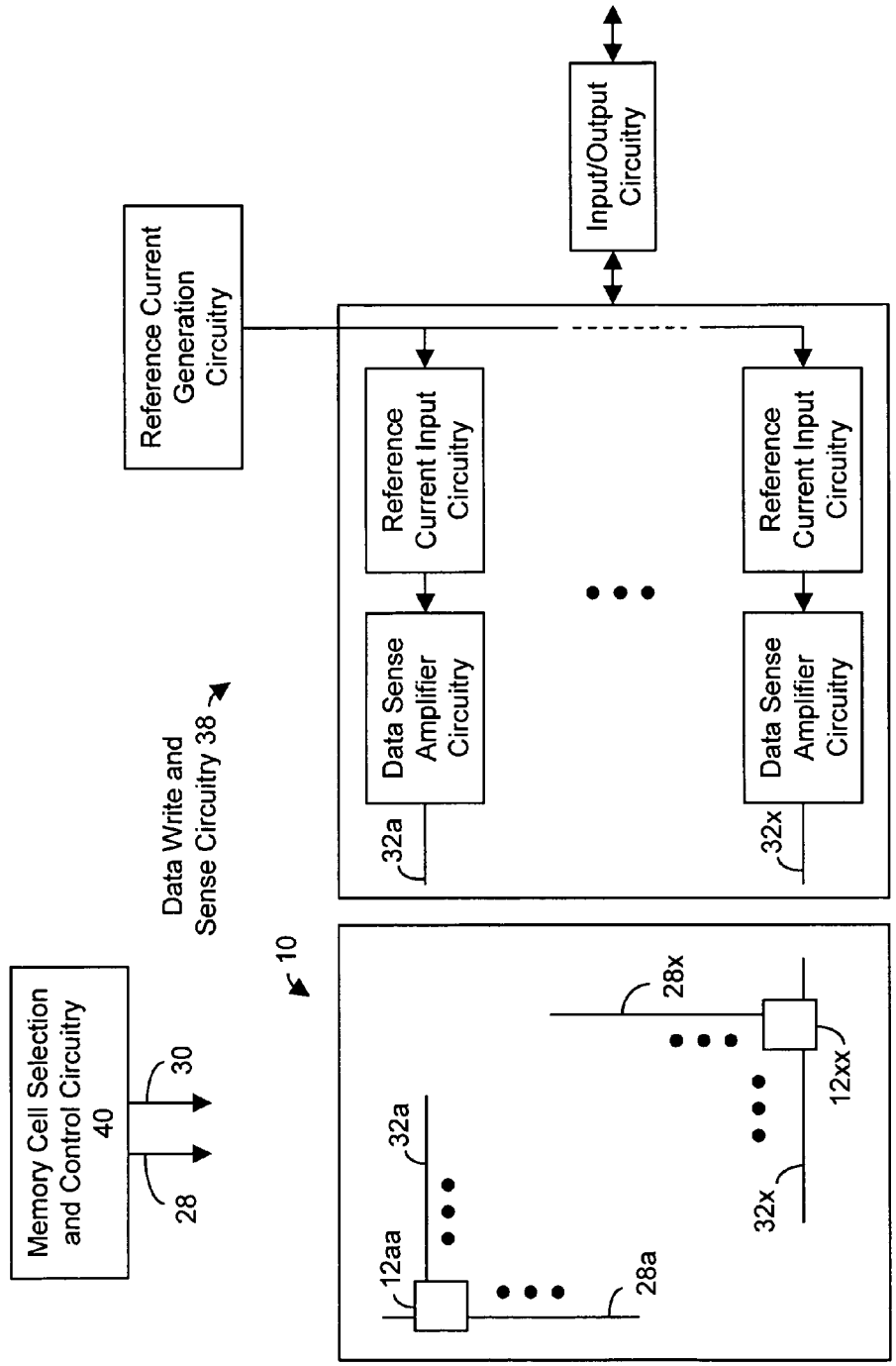
FIG. 14 is a schematic block diagram of an embodiment of an integrated circuit device including, among other things, a memory cell array, data sense and write circuitry, memory cell selection and control circuitry, according to certain aspects of the present inventions.

For example, with reference to FIG. 14, the integrated circuit device may include array 10, having a plurality of memory cells 12, data write and sense circuitry 40, and memory cell selection and control circuitry 42. The data write and sense circuitry 40 reads data from and writes data to selected memory cells 12. In one embodiment, data write and sense circuitry 40 includes a plurality of data sense amplifiers. Each data sense amplifier receives at least one bit line 32 and an output of reference generator circuitry (for example, a current or voltage reference signal).

The memory arrays may be comprised of an N-channel, a P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for the sake of brevity, these discussions will not be repeated.

Moreover, the memory cell(s), memory array and techniques for operating (for example, reading, writing, restoring and refreshing) such memory cell(s) and/or arrays of the present inventions may be employed in conjunction with any architecture, layout, structure, control circuitry and/or configuration employing such electrically floating body memory cells (among other types of memory cells). For example, the memory cell(s) and memory array of the present inventions may be implemented in the architecture, layout, structure, control circuitry and/or configuration described and illustrated in the following U.S. patent applications:

(1) U.S. Non-Provisional patent application Ser. No. 10/487,157, which was filed by Fazan et al. on Feb. 18, 2004 and entitled "Semiconductor Device" (now U.S. Pat. No. 7,061,050);

(2) U.S. Non-Provisional patent application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(3) U.S. Non-Provisional patent application Ser. No. 11/096,970, which was filed by Ferrant et al. and entitled "Semiconductor Memory Device and Method of Operating Same" (now U.S. Pat. No. 7,085,156);

(4) U.S. Non-Provisional patent application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (U.S. Patent Application Publication No. 2005/0063224);

(5) U.S. Non-Provisional patent application Ser. No. 10/840,902, which was filed by Portmann et al. on May 7, 2004 and entitled "Reference Current Generator, and Method of Programming, Adjusting and/or Operating Same" (now U.S. Pat. No. 6,912,150);

(6) U.S. Non-Provisional patent application Ser. No. 11/515,667, which was filed by Bauser on Sep. 5, 2006, and entitled "Method and Circuitry to Generate a Reference Current for Reading a Memory Cell, and Device Implementing Same";

(7) U.S. Provisional Patent Application Ser. No. 60/790,111, which was filed by Carman on Apr. 7, 2006, and entitled "Memory Array Having a Programmable Word Length, and Technique of Implementing Same";

(8) U.S. Provisional Patent Application Ser. No. 60/792,820, which was filed by Popoff on Apr. 18, 2006, and entitled "Semiconductor Memory Array Architecture, and Method of Controlling Same";

(9) U.S. Provisional Patent Application Ser. No. 60/796,671, which was filed by Okhonin et al. on May 2, 2006, and entitled "Semiconductor Memory Cell and Array Using Punch-Through to Program and Read Same"; and

(10) U.S. Provisional Patent Application Ser. No. 60/830,084, which was filed by Fisch et al. on Jul. 11, 2006, entitled "Integrated Circuit Having Memory Array Having a Segmented Bit Line Architecture and Method of Controlling and/or Operating Same".

The entire contents of these ten (10) U.S. patent applications, including, for example, the inventions, features, attributes, architectures, configurations, materials, techniques and advantages described and illustrated therein, are incorporated by reference herein. For the sake of brevity, those discussions will not be repeated; rather those discussions (text and illustrations), including the discussions relating to the memory cell, architecture, layout, structure, are incorporated by reference herein in its entirety.

Notably, the memory cells may be controlled (for example, programmed or read) using any of the control circuitry described and illustrated in the above-referenced ten (10) U.S. patent applications. For the sake of brevity, those discussions will not be repeated and are incorporated herein by reference. Indeed, all memory cell selection and control circuitry, and techniques for programming, reading, controlling and/or operating memory cells including transistors having strained electrically floating body regions, whether now known or later developed, are intended to fall within the scope of the present inventions. Indeed, the data stored in or written into memory cells 12 may be read using any circuitry and/or technique (whether conventional or not), including those described in the above-referenced ten (10) U.S. patent applications.

The data write and sense circuitry may include a sense amplifier to read the data stored in memory cells 12. The sense amplifier (for example, a cross-coupled sense amplifier as described and illustrated in the (1) U.S. patent application Ser. No. 11/299,590 ((U.S. Patent Application Publication No. 2006/0126374), which was filed by Waller and Carman, on Dec. 12, 2005 and entitled "Sense Amplifier Circuitry and Architecture to Write Data into and/or Read from Memory Cells", and/or (2) U.S. patent application Ser. No. 10/840,902, which was filed by Portmann et al. on May 7, 2004, and entitled "Reference Current Generator, and Method of Programming, Adjusting and/or Operating Same", now U.S. Pat. No. 6,912,150 (identified above), the applications are incorporated herein by reference in its entirety) may sense the data state stored in memory cell 12 using voltage or current sensing circuitry and/or techniques. In the context of a current sense amplifier, the current sense amplifier may compare the cell current to a reference current, for example, the current of a reference cell (not illustrated). From that comparison, it may be determined whether memory cell 12 contained a logic high (relatively more majority carries 34 contained within body region 18) or logic low data state (relatively less majority carries 28 contained within body region 18). Such circuitry and configurations thereof are well known in the art.

The present inventions may employ the reference generation techniques (used in conjunction with the data sense circuitry for the read operation) U.S. Non-Provisional patent application Ser. No. 11/515,667, which was filed by Bauser on Sep. 5, 2006, and entitled "Method and Circuitry to Generate a Reference Current for Reading a Memory Cell, and Device Implementing Same" (identified above). Indeed, the present inventions may also employ the read circuitry, architectures and techniques described and illustrated in U.S. Pat. No. 6,912,150, identified above.

It should be further noted that while each memory cell 12 in the exemplary embodiments (described above) includes at least one transistor 14, memory cell 12 may include a differential transistor pair, as described and illustrated in application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163, now U.S. Pat. No. 7,085,153). As mentioned above, any of the architectures, layouts, structures and/or configurations, as well as the programming and reading operations described and illustrated in application Ser. No. 10/829,877 may be employed in conjunction with the inventions described and illustrated herein. For the sake of brevity, those discussions will not be repeated; rather, they are incorporated by reference herein.

The electrically floating memory cells, transistors and/or memory array(s) may be fabricated using well known techniques and/or materials. Indeed, any fabrication technique and/or material, whether now known or later developed, may be employed to fabricate the electrically floating body memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating transistors, memory cells, and/or memory array(s) may employ the techniques described and illustrated in (1) non-provisional patent application entitled "Integrated Circuit Device, and Method of Fabricating Same", which was filed on Jul. 2, 2004, by Fazan, Ser. No. 10/884,481 and/or (2) non-provisional patent application entitled "One Transistor Memory Cell having a Strained Electrically Floating Body Region, and Method of Operating Same", which was filed on Oct. 12, 2006, and assigned Ser. No. 11/580,169, by Bassin (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Indeed, memory array 10 (including SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors-not illustrated)). Again, the entire contents of the Integrated Circuit Device Patent Applications, including, for example, the inventions, features, attributes, architectures, configurations, materials, techniques and advantages described and illustrated therein, are hereby incorporated by reference.

Further, the memory arrays may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Non-Provisional patent application Ser. No. 10/487,157, which was filed by Fazan et al. on Feb. 18, 2004 and entitled "Semiconductor Device" (U.S. Patent Application Publication No. 2004/0238890). All such techniques, whether now known or later developed, are intended to fall within the scope of the present inventions.

The electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, as mentioned above, the illustrated/exemplary voltage levels to implement the read and write operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the source, drain or gate voltages) become or are positive and negative.

As noted above, the access regions of active access element 36 may be portions of access lines AL1 and AL2 which interact with the associated transistor 14 or the access regions of active access element 36 may electrically connect to access lines AL1 and AL2 (in a manner similar to a word line 28 connecting to a gate of a transistor 16). As noted above, the access regions and/or lines AL1 and AL2 of an active access element 36 are collectively identified "access lines" unless such aspect(s) of the active access element is/are stated as an "access region", for example, as set forth in certain of the claims.

The above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

The invention claimed is:

1. An integrated circuit, disposed in or on a semiconductor region or layer which resides on or above a non-conducting portion of a substrate, the integrated circuit comprising:

a semiconductor memory cell including:
  a transistor including:
    a first semiconductor region including impurities to provide a first conductivity type;
    a second semiconductor region including impurities to provide the first conductivity type;
    a body region disposed between the first semiconductor region, the second semiconductor region and the non-conducting portion of the substrate, wherein the body region is electrically floating and includes impurities to provide a second conductivity type wherein the second conductivity type is different from the first conductivity type;
    a gate spaced apart from the body region; and
    wherein the semiconductor memory cell stores (1) a first data state which corresponds to a first charge in the body region of the transistor of the memory cell, and (2) a second data state which corresponds to a second charge in the body region of the transistor of the memory cell; and
  an active access element, electrically coupled to the transistor, including a first access line, a second access line and a control node, wherein the control node of the active access element and the second semiconductor region of the transistor are a common region.

2. The integrated circuit of claim 1 wherein the first access line is a semiconductor region including impurities to provide the second conductivity type.

3. The integrated circuit of claim 2 wherein the second access line is comprised of a metal material.

4. The integrated circuit of claim 2 wherein the second access line is comprised of a semiconductor material.

5. The integrated circuit of claim 2 wherein the second access line is comprised of a doped semiconductor material.

6. The integrated circuit of claim 1 wherein the active access element further includes a dielectric, disposed between the first access line and the second access line.

7. The integrated circuit of claim 1 wherein the integrated circuit is disposed in or on a semiconductor-on-insulator substrate.

8. The integrated circuit of claim 1 wherein the integrated circuit is disposed in or on a bulk-type substrate.

9. The integrated circuit of claim 1 wherein the first access line is a semiconductor region having a conductivity type which is different from the first conductivity type.

10. The integrated circuit of claim 9 wherein the second access line is comprised of a metal material or a semiconductor material.

11. The integrated circuit of claim 1 wherein:
  an amount of charge of the first charge is greater than an amount of charge of the second charge, and
  in response to first write control signals applied to the memory cell to write the first data state therein, the active access element generates a first bipolar current which substantially provides the first charge in the body region of the transistor.

12. An integrated circuit, disposed in or on a semiconductor region or layer which resides on or above a non-conducting portion of a substrate, the integrated circuit comprising:
  a plurality of semiconductor memory cells arranged in a matrix of rows and columns, each semiconductor memory cell includes a transistor and an active access element, wherein the transistor is electrically coupled to the active access element, and wherein:
  the transistor includes:
    a first semiconductor region having impurities to provide a first conductivity type;
    a second semiconductor region having impurities to provide the first conductivity type;
    a body region disposed between the first semiconductor region, the second semiconductor region and the non-conducting portion of the substrate, wherein the body region is electrically floating and includes impurities to provide a second conductivity type wherein the second conductivity type is different from the first conductivity type;
    a gate spaced apart from the body region: and
    wherein each semiconductor memory cell stores (1) a first data state which corresponds to a first charge in the body region of the transistor of the memory cell, and (2) a second data state which corresponds to a second charge in the body region of the transistor of the memory cell; and
  the active access element includes a first access line, a second access line and a control node, wherein two adjacent memory cells share an active access element.

13. The integrated circuit of claim 12 wherein the first access line is comprised of a semiconductor region including impurities to provide the second conductivity type.

14. The integrated circuit of claim 13 wherein the second access line is comprised of a metal material or a semiconductor material.

15. The integrated circuit of claim 12 wherein the control node of the active access element and the second semiconductor region of the associated transistor are a common region.

16. The integrated circuit of claim 12 wherein the active access element further includes a dielectric, disposed between the first access line and the second access line.

17. The integrated circuit of claim 12 wherein the integrated circuit is disposed in or on a semiconductor-on-insulator substrate.

18. The integrated circuit of claim 12 wherein the integrated circuit is disposed in or on a bulk-type substrate.

19. The integrated circuit of claim 12 wherein the first access line is comprised of a semiconductor region to provide conductivity type which is different from the first conductivity type.

20. The integrated circuit of claim 19 wherein the second access line is comprised of a metal material or a semiconductor material.

21. The integrated circuit of claim 12 wherein:
  an amount of charge corresponding to the first charge is greater than an amount of charge corresponding to the second charge, and
  in response to first write control signals applied to a selected memory cell of the plurality of memory cells, the active access element of the selected memory cell generates a first bipolar current which substantially provides the first charge in the body region of the transistor of the selected memory cell.

22. An integrated circuit device comprising:
a memory cell array including a:
  plurality of word lines;
  plurality of bit lines;
  a plurality of first access lines;
  a plurality of second access lines; and
  a plurality of semiconductor memory cells arranged in a matrix of rows and columns, each semiconductor memory cell includes a transistor and an active access element, wherein the transistor is electrically coupled to the active access element, and wherein:

the transistor includes:
- a first semiconductor region, electrically coupled to an associated bit line, having impurities to provide a first conductivity type;
- a second semiconductor region having impurities to provide the first conductivity type;
- a body region disposed between the first semiconductor region, the second semiconductor region and a non-conducting portion of the substrate, wherein the body region is electrically floating and includes impurities to provide a second conductivity type wherein the second conductivity type is different from the first conductivity type;
- a gate, which is electrically coupled to an associated word line and spaced apart from the body region; and
- wherein each semiconductor memory cell stores (1) a first data state which corresponds to a first charge in the body region of the transistor of the memory cell, and (2) a second data state which corresponds to a second charge in the body region of the transistor of the memory cell; and the active access element includes a first access region electrically coupled to an associated first access line, a second access region electrically coupled to an associated second access line, and a control node.

23. The integrated circuit of claim 22 wherein the first access region is a semiconductor region including impurities to provide the second conductivity type.

24. The integrated circuit of claim 23 wherein the second access region is comprised of a metal material or a semiconductor material.

25. The integrated circuit of claim 22 wherein the control node of the active access element and the second semiconductor region of the associated transistor are a common region.

26. The integrated circuit of claim 22 wherein two adjacent memory cells share an active access element.

27. The integrated circuit of claim 22 wherein two adjacent memory cells share at least a portion of the first access region of the associated active access element.

28. The integrated circuit of claim 27 wherein the first semiconductor region of the transistors of the two adjacent memory cells are connected to the same bit line.

29. The integrated circuit of claim 22 wherein the active access element further includes a dielectric, disposed between the first access region and the second access region.

30. The integrated circuit of claim 22 wherein the integrated circuit is disposed (i) in or on a semiconductor-on-insulator substrate or (ii) in or on a bulk-type substrate.

31. The integrated circuit of claim 22 wherein the first access region is a semiconductor region having a conductivity type which is different from the first conductivity type.

32. The integrated circuit of claim 31 wherein the second access region is comprised of a metal material or a semiconductor material.

33. The integrated circuit of claim 22 wherein:
- an amount of charge corresponding to the first charge is greater than an amount of charge corresponding to the second charge, and
- in response to first write control signals applied to a selected memory cell of the plurality of memory cells, the active access element of the selected memory cell generates a first bipolar current which substantially provides the first charge in the body region of the transistor of the selected memory cell.

34. An integrated circuit, disposed in or on a semiconductor region or layer which resides on or above a non-conducting portion of a substrate, the integrated circuit comprising:
- a plurality of semiconductor memory cells arranged in a matrix of rows and columns, each semiconductor memory cell includes a transistor and an active access element, wherein the transistor is electrically coupled to the active access element, and wherein:

the transistor includes:
- a first semiconductor region having impurities to provide a first conductivity type;
- a second semiconductor region having impurities to provide the first conductivity type;
- a body region disposed between the first semiconductor region, the second semiconductor region and the non-conducting portion of the substrate, wherein the body region is electrically floating and includes impurities to provide a second conductivity type wherein the second conductivity type is different from the first conductivity type;
- a gate spaced apart from the body region; and
- wherein each semiconductor memory cell stores (1) a first data state which corresponds to a first charge in the body region of the transistor of the memory cell, and (2) a second data state which corresponds to a second charge in the body region of the transistor of the memory cell; and the active access element includes a first access line, a second access line and a control node, wherein two adjacent memory cells share at least a portion of the first access line of the associated active access element.

35. The integrated circuit of claim 34 wherein:
- an amount of charge corresponding to the first charge is greater than an amount of charge corresponding to the second charge, and
- in response to first write control signals applied to a selected memory cell of the plurality of memory cells, the active access element of the selected memory cell generates a first bipolar current which substantially provides the first charge In the body region of the transistor of the selected memory cell.

* * * * *